(12) United States Patent
Yu

(10) Patent No.: US 6,320,230 B1
(45) Date of Patent: Nov. 20, 2001

(54) SILICON-CONTROLLED RECTIFIER INTEGRAL WITH OUTPUT BUFFER

(75) Inventor: Ta-Lee Yu, Hsinchu Hsien (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/330,666

(22) Filed: Jun. 11, 1999

Related U.S. Application Data

(62) Division of application No. 09/093,426, filed on Jun. 8, 1998, now Pat. No. 5,986,307.

(30) Foreign Application Priority Data

Sep. 1, 1998 (TW) .................................................. 87100241

(51) Int. Cl.$^7$ .................................................. H01L 23/62
(52) U.S. Cl. ........................ 257/355; 257/350; 257/355; 438/197; 438/199; 438/133; 438/579; 438/574
(58) Field of Search .................................... 257/350–355; 438/279–301, 197–199, 14, 17, 133, 574–599

(56) References Cited

U.S. PATENT DOCUMENTS

| | | |
|---|---|---|
| 5,041,895 * | 8/1991 | Contiero et al. .................... 357/43 |
| 5,326,994 | 7/1994 | Giebel et al. . |
| 5,455,436 | 10/1995 | Cheng . |
| 5,576,557 * | 11/1996 | Ker et al. ............................ 257/173 |
| 5,576,570 | 11/1996 | Ohsawa et al. . |
| 5,682,047 | 10/1997 | Consiglio et al. . |
| 5,714,796 | 2/1998 | Chishiki . |
| 5,742,085 | 4/1998 | Yu . |
| 5,949,634 * | 9/1999 | Yu ....................................... 361/111 |
| 5,962,876 * | 10/1999 | Yu ....................................... 257/133 |

FOREIGN PATENT DOCUMENTS

0772237-A2 * 10/1996 (EP) .............................. H01L/27/02

* cited by examiner

Primary Examiner—Matthew Smith
Assistant Examiner—Granvill D Lee, Jr.
(74) Attorney, Agent, or Firm—Ladas & Parry

(57) ABSTRACT

A silicon-rectifier integral with either an NMOS transistor or a PMOS transistor (together which constitute an output buffer) is disclosed. If integral with the NMOS transistor, the silicon-controlled rectifier is provided with the emitter and base of the NPN bipolar junction transistor acting as the source and bulk of the NMOS transistor. On the other hand, if integral with the PMOS transistor, the silicon-controlled rectifier is provided with the emitter and base of the PNP bipolar junction transistor acting as the source and bulk of the PMOS transistor.

8 Claims, 6 Drawing Sheets

SILICON-CONTROLLED RECTIFIER INTEGRAL WITH OUTPUT BUFFER

This is a divisional of application Ser. No. 09/093,426 filed on Jun. 8, 1998 now U.S. Pat. No. 5,986,307.

BACKGROUND OF THE INVENTION

1. Field of the Invention

The present invention in general relates to semiconductor integrated circuit technology. More particularly, the present invention relates to a silicon-controlled rectifier integral with an output buffer.

2. Description of the Prior Art

Electrostatic discharge, ESD hereinafter, is a common phenomenon that occurs during the handling of semiconductor integrated circuit, IC hereinafter, devices. Electrostatic charges may accumulate and cause potentially destructive effects on an IC device. ESD stressing typically can occur during a testing phase of IC fabrication, during installation of the IC onto a circuit board, as well as during use of equipment into which the IC has been installed. Damage to a single IC due to poor ESD protection in an electronic device can partially or sometimes completely disrupt its operation.

There are several ESD stress models based on the reproduction of typical discharge pulses to which the IC may be exposed during manufacturing or handling. Three standards models, known as the Human Body Model (HBM), Machine Model (MM), and Charged Device Model (CDM) have been proposed. The human-body model is set forth in U.S. Military Standard MIL-STD-883, Method 3015.6. The military standard models the electrostatic stress produced on an IC device when a human carrying electrostatic charges touches the lead pins of the IC device. The machine model is set forth in Industry Standard EIAJ-IC-121, which describes the electrostatic stress produced on an IC device when a machine carrying electric charges contacts the lead pins of the IC-device. The charged device model describes the ESD current generated when an IC already carrying electric charges is grounded while being handled.

Referring to FIG. 1, a conventional output buffer is schematically illustrated. The conventional output buffer, which comprises an NMOS transistor Mn and a PMOS transistor Mp, is arranged between an output pad 1 and an internal circuit 2. The NMOS transistor Mn and PMOS transistor Mp are configured with their gates coupled to the internal circuit 2, whose drains are coupled together to the output pad 1. In addition, the NMOS transistor Mn is provided with its source connected to $V_{ss}$ node, and the PMOS transistor Mp is provided with its source connected to $V_{DD}$ node. When ESD stress occurs to the output pad 1, either a $N^+/P$ junction between the drain and bulk of the NMOS transistor Mn or a $P^+/N$ junction between the drain and bulk of the PMOS transistor Mp enters breakdown to bypass the ESD stress, thereby preventing the internal circuit 2 from ESD damage.

However, with the trend toward submicron scale IC fabrication in view, CMOS ICs have become more vulnerable to ESD damage due to advanced processes, such as use of a lightly-doped drain ("LDD") structure and clad silicide diffusions. Under these circumstances, additional fabrication steps are required in order to sustain ESD immunity. Moreover, a spacing of at least 5 μm between each contact region and polysilicon gate is required so as to uniformly conduct an ESD discharge current and thus prevent the dissipated heat from excessive concentration. Such a concern gives rise to an increase in layout area.

Therefore, modifications to the conventional output buffer presented in FIG. 1 have been proposed and schematically illustrated in FIGS. 2 and 3.

Referring to FIG. 2, a silicon-controlled rectifier 3 is added to the output buffer, positioned between the output pad 1 and a $V_{ss}$ node. Preferably, the silicon-controlled rectifier 3 can be a MLSCR (modified lateral silicon-controlled rectifier) disclosed in C. Duvvury and A. Ameraskera, "ESD: A PERVASIVE CONCERN FOR IC TECHNOLOGIES," Proceedings IEEE, 1993, pp.690–702, or a LVTSCR (low voltage triggering silicon-controlled rectifier) disclosed in U.S. Pat. No. 5,465,189. When an ESD pulse positive to the $V_{ss}$ node occurs to the output pad 1, the silicon-controlled rectifier 3 conducts a current to provide a discharge path. Furthermore, a resistor R is connected between the output pad 1 and the drain of the NMOS transistor Mn to make the serial resistance thereof greater than that of the discharge path provided by the silicon-controlled rectifier 3, thereby insuring the discharge current is kept away from the output buffer.

Further referring to FIG. 2, the silicon-controlled rectifier is configured with its anode 31 and cathode 32 connected to the output pad 1 and the $V_{ss}$ node, respectively. The silicon-controlled rectifier 3 comprises a PNP bipolar junction transistor Qp, an NPN bipolar junction transistor Qn, and two load resistors Rp and Rn. The PNP transistor Qp has its emitter as the anode 31 of silicon-controlled rectifier 3. Moreover, the PNP transistor Qp is configured with its base tied to the collector of the NPN transistor Qn to be an anode gate 33, and with its collector tied to the base of the NPN transistor Qn to be a cathode gate 34. However, the NPN transistor Qn is provided with its emitter to be the cathode 32 of the silicon-controlled rectifier 3. The load resistor Rn is connected between the anode 31 and the anode gate 33 while the load resistor Rp is connected between the cathode 32 and the cathode gate 34.

Referring to FIG. 3, a silicon-controlled rectifier 3 is added to the output buffer, but positioned between the output pad 1 and a $V_{DD}$ node. Preferably, the silicon-controlled rectifier 3 can be a MLSCR (modified lateral silicon-controlled rectifier) disclosed in C. Duvvury and A. Ameraskera, "ESD: A PERVASIVE CONCERN FOR IC TECHNOLOGIES," Proceedings IEEE, 1993, pp.690–702, or a LVTSCR (low voltage triggering silicon-controlled rectifier) disclosed in U.S. Pat. No. 5,465,189. When an ESD pulse negative to the $V_{DD}$ node occurs to the output pad 1, the silicon-controlled rectifier 3 conducts a current to provide a discharge path. Furthermore, a resistor R is connected between the output pad 1 and the drain of the PMOS transistor Mp to make the serial resistance thereof greater than that of the discharge path provided by the silicon-controlled rectifier 3, thereby insuring the discharge current is kept away from the output buffer.

Further referring to FIG. 3, the silicon-controlled rectifier is configured with its anode 31 and cathode 32 connected to the $V_{DD}$ node and the output pad 1, respectively. The silicon-controlled rectifier 3 comprises a PNP bipolar junction transistor Qp, an NPN bipolar junction transistor Qn, and two load resistors Rp and Rn. The PNP transistor Qp has its emitter as the anode 31 of silicon-controlled rectifier 3. Moreover, the PNP transistor Qp is configured with its base tied to the collector of the NPN transistor Qn to be an anode gate 33, and with its collector tied to the base of the NPN transistor Qn to be a cathode gate 34. However, the NPN transistor Qn is provided with its emitter as the cathode 32 of silicon-controlled rectifier 3. The load resistor Rn is connected between the anode 31 and the anode gate 33 while the load resistor Rp is connected between the cathode 32 and the cathode gate 34.

However, the addition of the resistor R restrains the entire integrated circuit to a lower operation speed. Furthermore, the arrangement of the silicon-controlled rectifier 3 and the resistor R means that a great deal of layout area is required, and is thus disadvantageous to the miniaturization of the integrated circuit. In addition, the NMOS transistor Mn, the PMOS transistor Mp, and the silicon-controlled rectifier 3 are connected in parallel with reference to the output pad 1. Accordingly, the spacing between each contact region and polysilicon gate must be kept wide enough to prevent the NMOS transistor Mn and the PMOS transistor Mp from experiencing an ESD stressing effect.

SUMMARY OF THE INVENTION

It is therefore an object of the present invention to provide a silicon-controlled rectifier integral with an output buffer, which is advantageous to the miniaturization of the integrated circuit and enhances the ESD immunity thereof.

The present invention achieves the above-indicated objects by providing a silicon-rectifier integral with either an NMOS transistor or a PMOS transistor (where the NMOS transistor and the PMOS transistor together constitute an output buffer). If integral with the NMOS transistor, the silicon-controlled rectifier is provided with the emitter and base of the NPN bipolar junction transistor acting as the source and bulk of the NMOS transistor. On the other hand, if integral with the PMOS transistor, the silicon-controlled rectifier is provided with the emitter and base of the PNP bipolar junction transistor acting as the source and bulk of the PMOS transistor.

In accordance with the present invention, a silicon-rectifier is integral with either an NMOS transistor or a PMOS transistor (together which constitute an output buffer). When an ESD pulse causes stress at an output pad, the MOS transistor integral with the silicon-controlled rectifier enters breakdown to trigger the conduction of the silicon-controlled rectifier. Accordingly, because they are no longer necessary to take up ESD protection, the required layout area for the MOS transistors can be decreased, and the output buffer can be implemented merely in consideration of its driving requirement. In addition, the triggered turn-on silicon-controlled rectifier conducts a great amount of discharge current. Therefore, such a structure is advantageous to the miniaturization of the integrated circuit and further enhances ESD immunity.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

In accordance with the present invention, a silicon rectifier is integral with either an NMOS transistor or a PMOS transistor (where the NMOS transistor and the PMOS transistor together constitute an output buffer). When an ESD pulse causes stress at an output pad, the MOS transistor integral with the silicon-controlled rectifier enters breakdown to trigger the conduction of the silicon-controlled rectifier. Accordingly, because they are no longer necessary to take up ESD protection, the required layout area for the MOS transistors can be decreased, and the output buffer can be implemented merely in consideration of its driving requirement. In addition, the triggered turn-on silicon-controlled rectifier conducts a great amount of discharge current. Therefore, such a structure is advantageous to the miniaturization of the integrated circuit and further enhances ESD immunity.

First Embodiment

Figure 1:
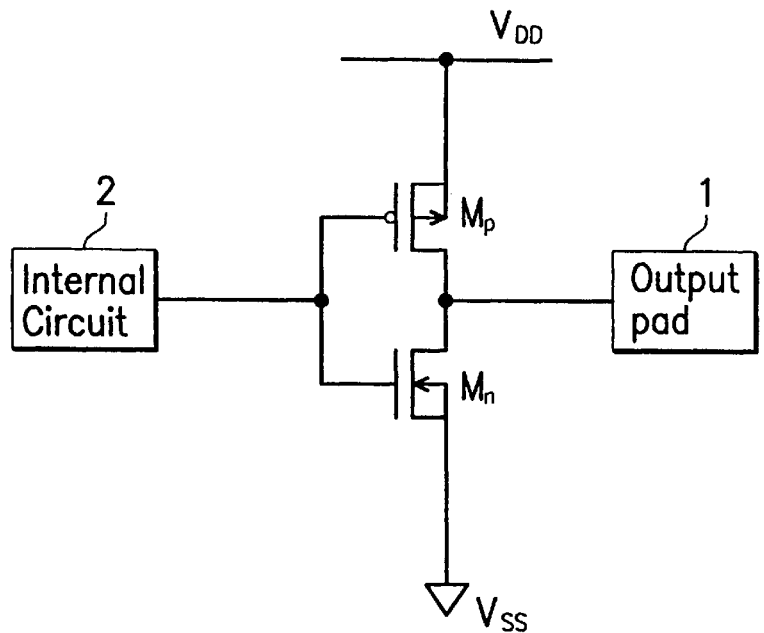
FIG. 1 schematically illustrates a circuit diagram of a conventional output buffer.
Figure 2:
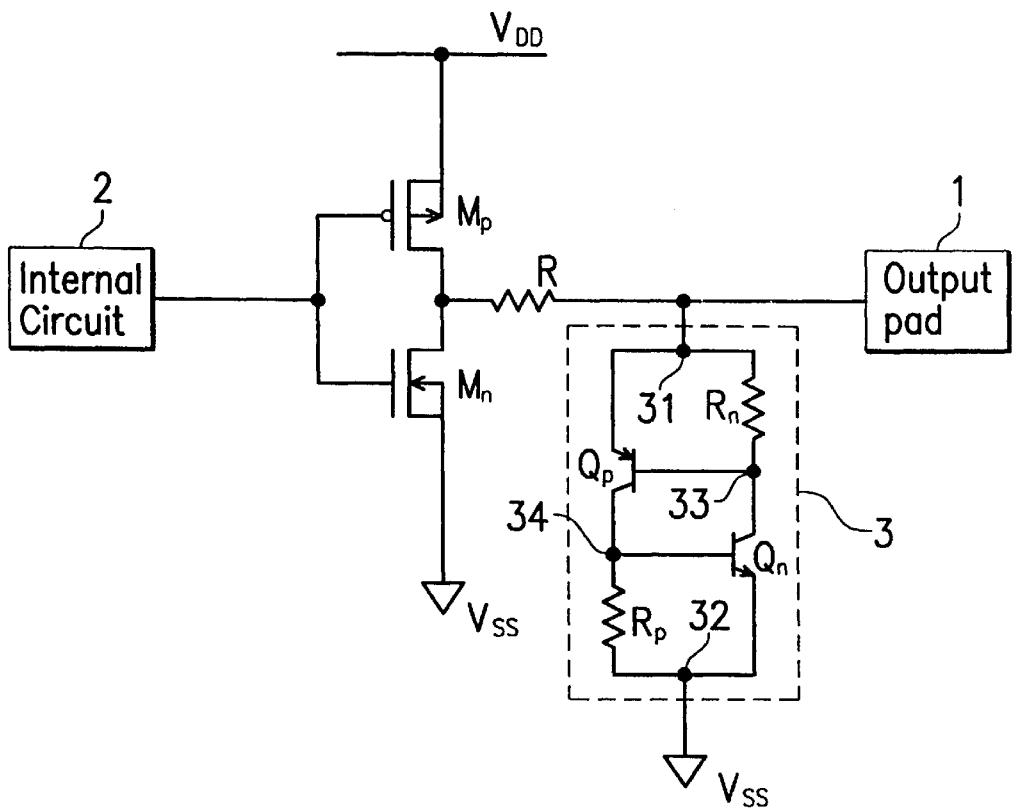
FIGS. 2 and 3 schematically illustrate respective circuit diagrams of two conventional ESD protection circuits arranged at an output pad.
Figure 3:
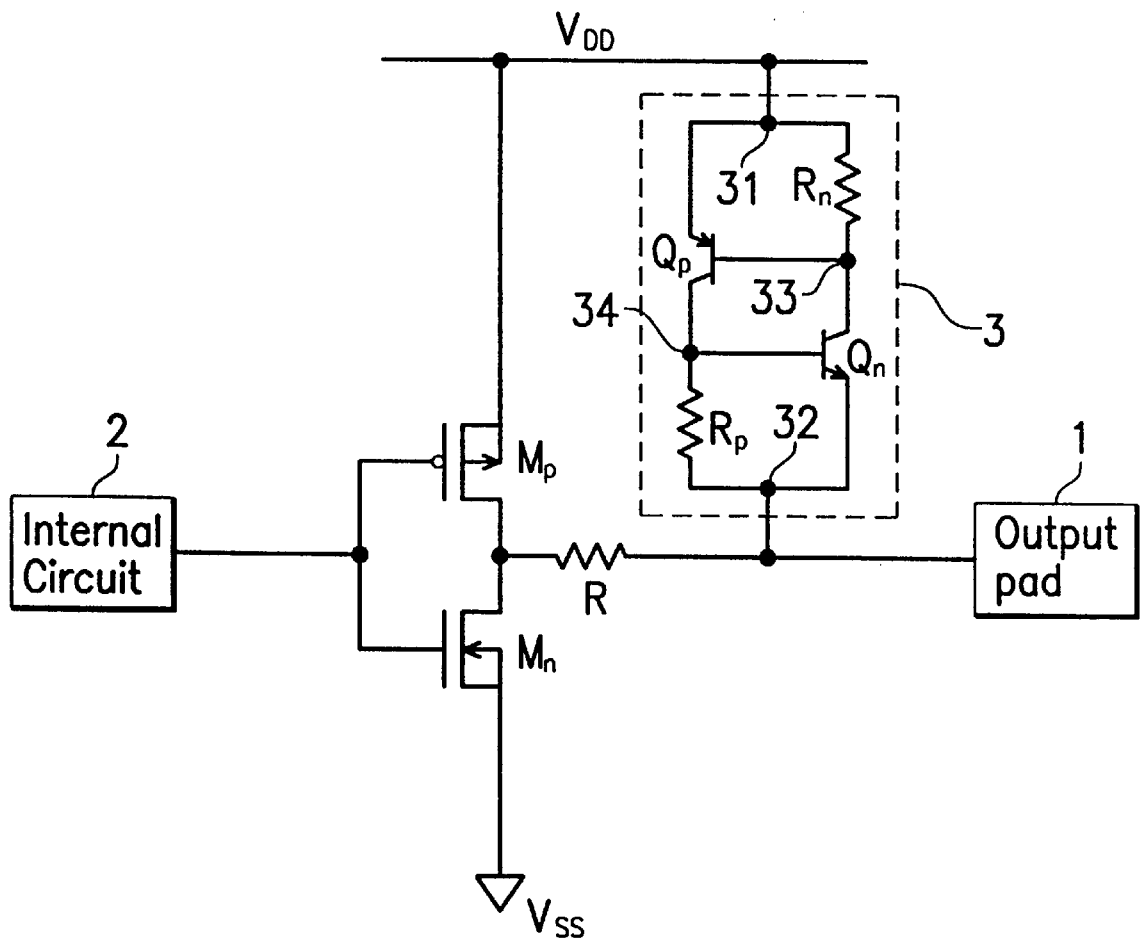
Figure 4:
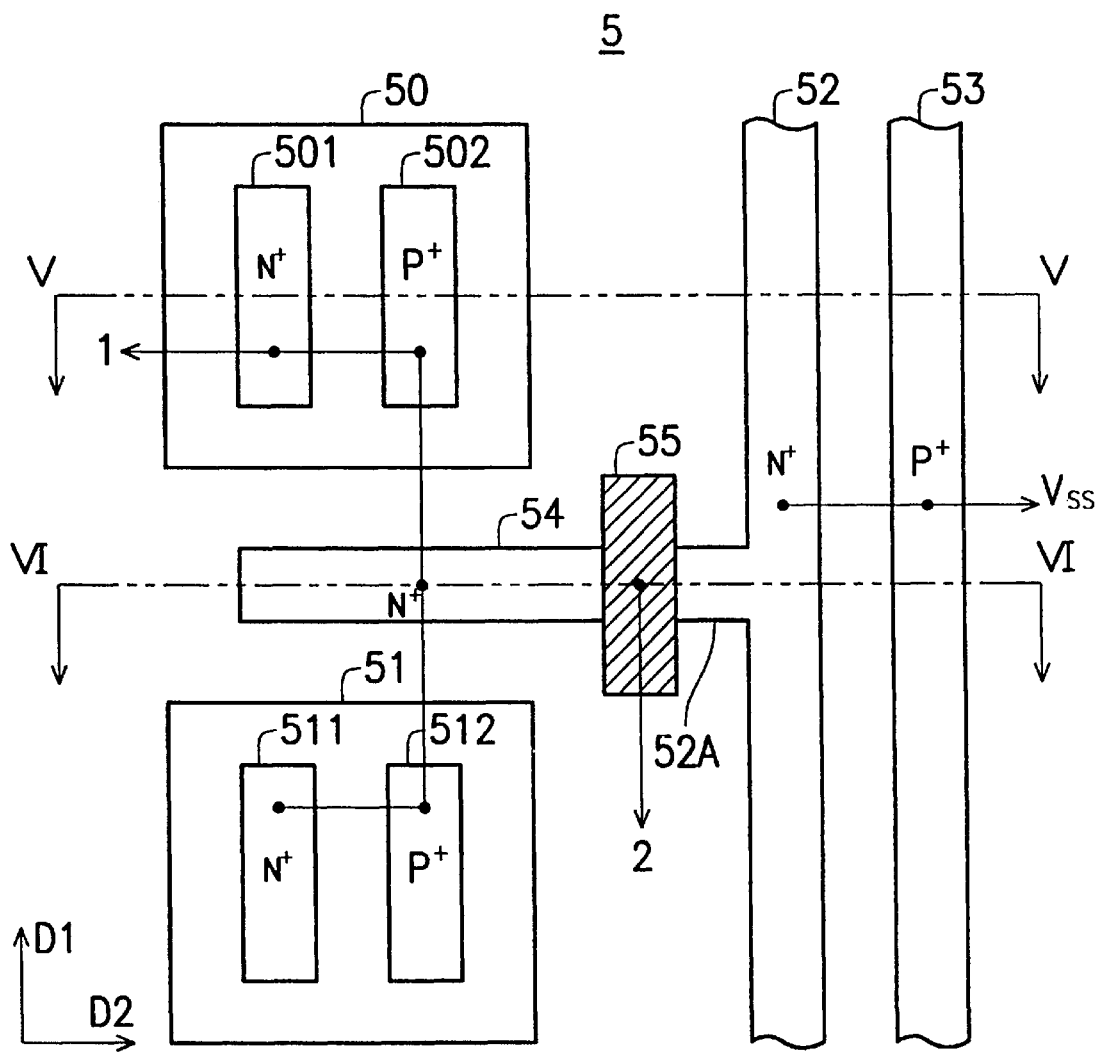
FIG. 4 illustrates a top view of one preferred embodiment in accordance with the present invention.

Referring to FIG. 4, one preferred embodiment in accordance with the present invention fabricated on a P-type silicon substrate 5 is illustrated from a top view. In the example, the NMOS transistor Mn is shown to be integral with the silicon-controlled rectifier 3 while the NMOS Mn is provided with a channel width less than 50 $\mu$m. For ease and clarity, a first direction D1 and a second direction D2 designate vertical and horizontal directions in the drawing, respectively. In the drawings, there are two N-wells 50 and 51 formed in the P-type silicon substrate 5, both of which are spaced apart from each other along the first direction D1. An N-type doped region 52 is formed in the P-type silicon substrate 5 extending along the first direction D1. In addition, the first N-type doped region 52 is spaced apart from and parallel to the nearest sides of the N-wells 50 and 51 along the second direction D2 if both N-wells 50 and 51 are shaped in square or rectangular. Furthermore, the N-type doped region 52 extends somewhat into the space between the two N-wells 50 and 51, forming an extension portion 52A. The N-type doped region 52 is thus configured with a T-shape. In addition, a P-type doped region 53 is formed in the P-type silicon substrate 5 along the first direction D1 so as be spaced apart from and preferably parallel to the first N-type doped region 52, to be the ohmic contact region of the P-type silicon substrate 5.

An N-type doped region 54 is formed in the P-type silicon substrate 5 between the N-wells 50 and 51, and aligned with the extension portion 52A as well as spaced apart from the N-type doped region 52. A gate structure 55 is formed to overlie the portion of the P-type silicon substrate 5 between the N-type doped regions 52 (specifically, the extension portion 52A) and 54. From bottom to top, the gate structure 55 comprises a dielectric layer and an electrode. Usually, the gate structure 55 somewhat overlaps the N-type doped regions 52 (specifically, the extension portion 52A) and 54 at each end. Moreover, an N-type doped region 501 and a P-type doped regions 502 are formed in the N-well 50, while an N-type doped region 511 and a P-type doped region 512 are formed in the N-well 51.

Further referring to FIG. 4, the N-type doped region 501, the P-type doped region 502, the N-type doped region 511, the P-type doped region 512, and the N-type doped region 54 are electrically connected to the output pad 1. The N-type doped region 52 and the P-type doped region 53 are electrically connected to the $V_{ss}$ node as well. The gate structure 55 is tied to the internal circuit 2 through its electrode.

Figure 5:
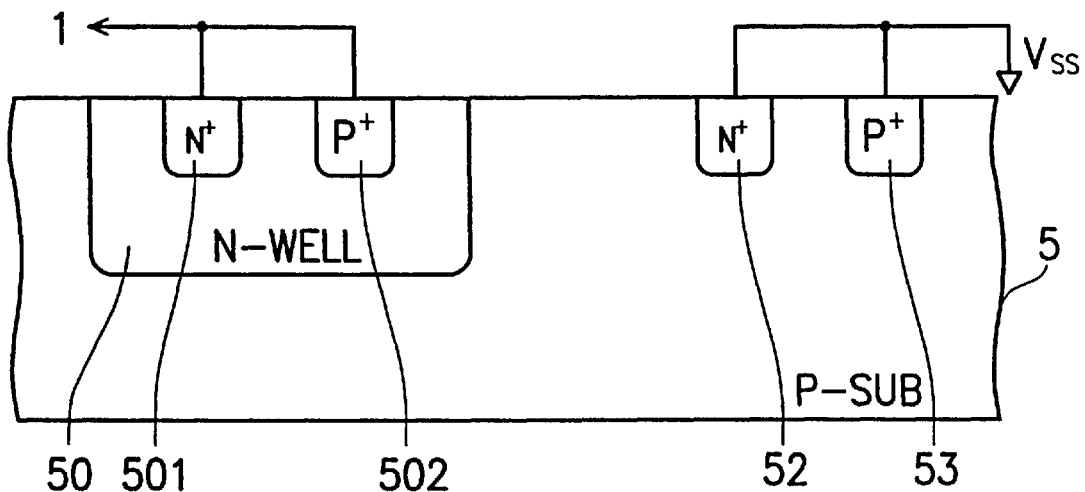
FIG. 5 illustrates a cross-sectional view taken along line V—V of FIG. 4.

Referring to FIG. 5, a cross-sectional view of FIG. 4, taken along line V—V, is illustrated. As shown in FIG. 5, the P-type doped region 502, the N-well 50 and the P-type silicon substrate 5 serve as the emitter, base and collector of the PNP bipolar junction transistor Qp, while the N-well 50, the P-type silicon substrate 5 and the N-type doped region 52 constitute the collector, base and emitter of the NPN bipolar junction transistor Qn. Because the transistors Qp and Qn are configured with their emitters respectively connected to the output pad 1 and $V_{ss}$ node, the N-type doped region 501 is therefore tied to the P-type doped region 502 and thus connected to the output pad 1, while the N-type doped region 52 is electrically connected to the P-type doped region 53 and thus connected to the $V_{ss}$ node. The resistors Rn and Rp stand for associated spreading resistance of the N-well 50 and the P-type silicon substrate 5, so as to enhance the stability of the silicon-controlled rectifier 3.

In the example, two silicon-controlled rectifier cells constitute the silicon-controlled rectifier 3. As above, the P-type doped region 512, the N-well 51, and the P-type silicon substrate 5 serve as the emitter, base and collector of the PNP bipolar junction transistor Qp, while the N-well 51, the P-type silicon substrate 5 and the N-type doped region 52 constitute the collector, base and emitter of the NPN bipolar junction transistor Qn. Because the transistors Qp and Qn are configured with their emitters connected to the output pad 1 and $V_{ss}$ node, respectively, the N-type doped region 511 is therefore tied to the P-type doped region 512 and thus connected to the output pad 1, while the N-type doped region 52 is electrically connected to the P-type doped region 53 and thus connected to the $V_{ss}$ node. The resistors Rn and Rp stand for associated spreading resistance of the N-well 51 and the P-type silicon substrate 5 as well, so as to enhance the stability of the silicon-controlled rectifier 3.

Figure 6:
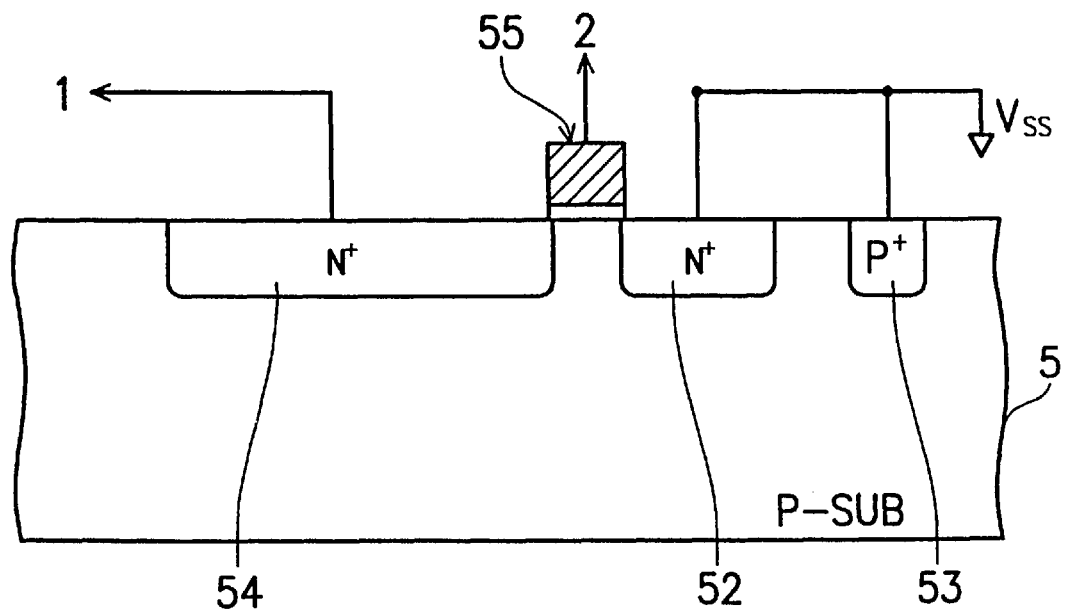
FIG. 6 illustrates a cross-sectional view taken along line VI—VI of FIG. 4.

Referring to FIG. 6, a cross-sectional view of FIG. 4, taken along line VI—VI, is illustrated. As shown in FIG. 6, the NMOS transistor Mn is provided with its drain, gate, and source constituted by the N-type doped region 54, gate structure 55, and N-type doped region 52, respectively. The N-type doped region 54 is connected to the pad 1 when the N-type doped region 52 is connected to the $V_{ss}$ node. However, the gate structure 55 is coupled to the internal circuit 2. Furthermore, although the layout of the NMOS transistor Mn is shown in a T-shape, multi-finger type, waffle-type, closed-loop (e.g., square, hexagon, octagon, etc.) are suited to implementing the NMOS layout as well.

As to the CMOS fabrication of 0.35~0.8 μm, the NMOS transistor Mn will enter breakdown at a voltage in the range of about 9~13V. When ESD stress occurs to the output pad 1, the NMOS transistor Mn first breaks down to immediately forward bias the junction between the P-type silicon substrate 5 and the N-type doped region 52 so that the NPN transistor Qn is turned on to trigger silicon-controlled rectifier 3 to operate in the snapback region and conduct a discharge current. According to the present invention, all the discharge current flows through the silicon-controlled rectifier 3 instead of the NMOS transistor Mn. Therefore, the conduction of the silicon-controlled rectifier 3 bypasses the ESD stress that occurs to the pad 1 and the internal circuit 2 can be protected from ESD damage.

Second Embodiment

Figure 7:
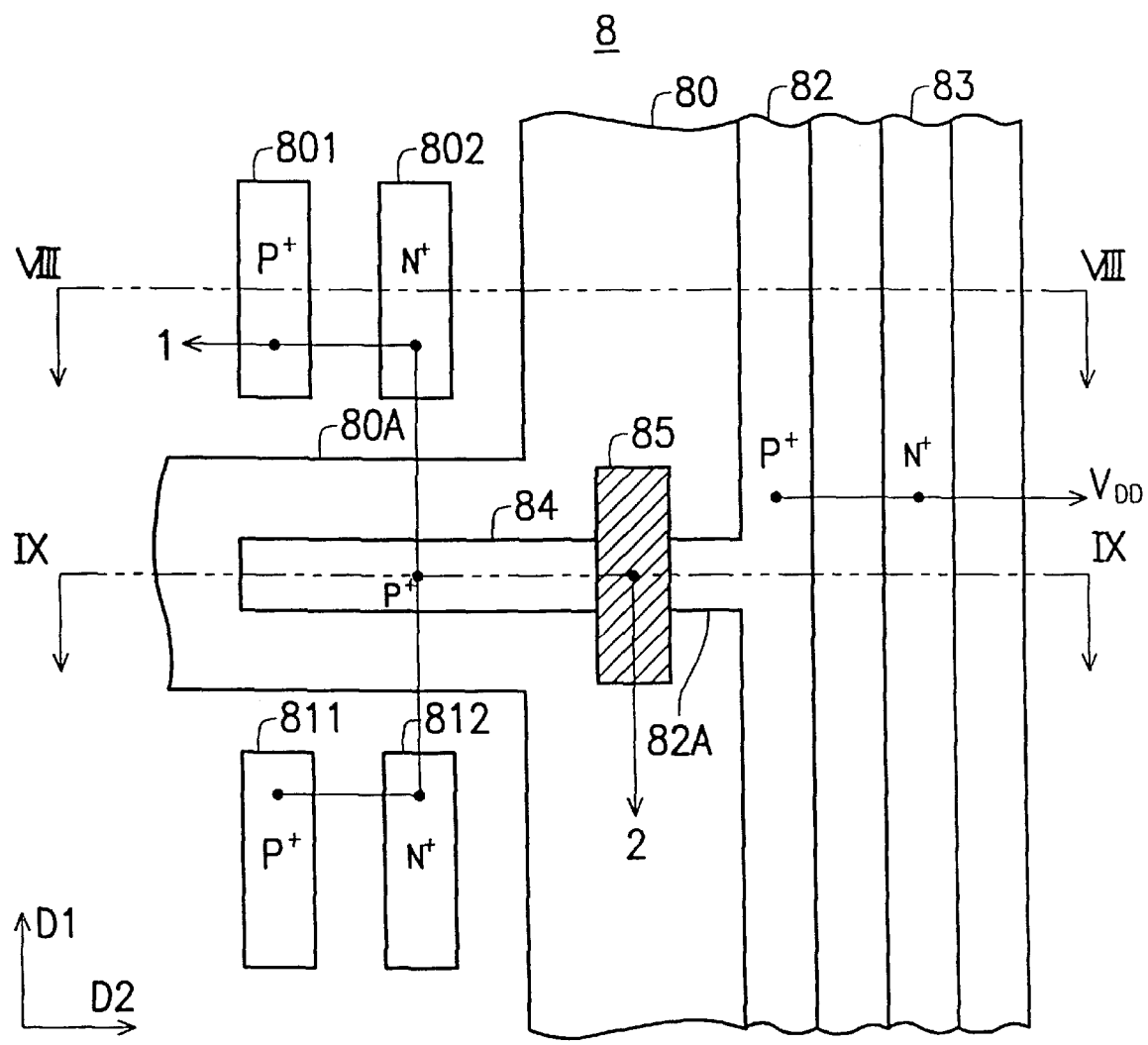
FIG. 7 illustrates a top view of another preferred embodiment in accordance with the present invention.

Referring to FIG. 7, another preferred embodiment in accordance with the present invention, which is fabricated on a P-type silicon substrate 8, is illustrated from a top view. In the example, the PMOS transistor Mp is shown to be integral with the silicon-controlled rectifier 3 while the PMOS Mp is provided with a channel width less than 50 μm. For ease and clarity, a first direction D1 and a second direction D2 designate vertical and horizontal directions in the drawing, respectively. In the drawings, there is an N-well 80 formed in the P-type silicon substrate 8, a portion of which projects along the second direction D2 to be an extrusion portion 80A. A P-type doped region 82 is formed in the N-well 80 extending along the first direction D1. In addition, the P-type doped region 82 extends along the second direction D2, having a portion extending somewhat toward the extrusion portion 80A to be an extension portion 82A. The P-type doped region 82 is thus configured with a T-shape. In addition, an N-type doped region 83 is formed in the N-well 80 along the first direction D1 so as be spaced apart from and preferably parallel to the P-type doped region 82 to be the ohmic contact region of the N-well 80.

A P-type doped region 84 is formed in the N-well 80 but within the extrusion portion 80A, and aligned with the extension portion 82A as well as spaced apart from the N-type doped region 82. A gate structure 85 is formed to overlie the portion of the N-well 80 between the P-type doped regions 82 (specifically, the extension portion 82A) and 84. From bottom to top, the gate structure 85 comprises a dielectric layer and an electrode. Usually, the gate structure 85 somewhat overlaps the P-type doped regions 82 (specifically, the extension portion 82A) and 84 at each end. Moreover, a P-type doped region 801 and an N-type doped regions 802 are formed in the P-type silicon substrate 8 at one side of the extrusion portion 80A, while a P-type doped region 811 and an N-type doped region 812 are formed in the P-type silicon substrate 8 at another side of the extrusion portion 80A.

Further referring to FIG. 7, the P-type doped region 801, the N-type doped region 802, the P-type doped region 811, the N-type doped region 812, and the P-type doped region 84 are electrically connected to the output pad 1. The P-type doped region 82 and the N-type doped region 83 are electrically connected to the $V_{DD}$ node as well. The gate structure 85 is tied to the internal circuit 2 through its electrode.

Figure 8:
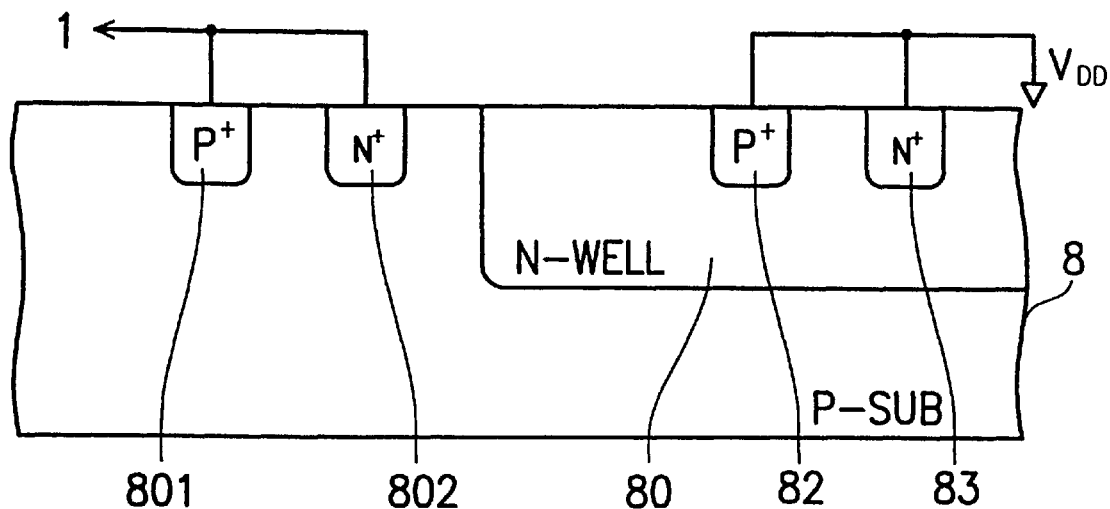
FIG. 8 illustrates a cross-sectional view taken along line VIII—VIII of FIG. 7.

Referring to FIG. 8, a cross-sectional view of FIG. 7, taken along line VIII—VIII, is illustrated. As shown in FIG. 8, the N-type doped region 802, the P-type silicon substrate 8 and the N-well 80 serve as the emitter, base and collector of the NPN bipolar junction transistor Qn, while the P-type silicon substrate 8, the N-well 80 and the P-type doped region 82 constitute the collector, base and emitter of the PNP bipolar junction transistor Qp. Because the transistors Qn and Qp are configured with their emitters connected to the output pad 1 and $V_{DD}$ node, respectively, the P-type doped region 801 is therefore tied to the N-type doped region 802 and thus connected to the output pad 1, while the P-type doped region 82 is electrically connected to the N-type doped region 83 and thus connected to the $V_{DD}$ node. The resistors Rn and Rp stand for associated spreading resistance of the N-well 80 and the P-type silicon substrate 8 as well, so as to enhance the stability of the silicon-controlled rectifier 3.

In the example, two silicon-controlled rectifier cells constitute the silicon-controlled rectifier 3. As above, the N-type doped region 812, the P-type silicon substrate 8, and the N-well 80 serve as the emitter, base and collector of the NPN bipolar junction transistor Qn, while the P-type silicon substrate 8, the N-well 80 and the P-type doped region 82 constitute the collector, base and emitter of the PNP bipolar junction transistor Qp. Because the transistors Qn and Qp are configured with their emitters connected to the output pad 1 and $V_{DD}$ node, respectively, the P-type doped region 811 is therefore tied to the N-type doped region 812 and thus connected to the output pad 1, while the N-type doped region 82 is electrically connected to the P-type doped region 83 and thus connected to the $V_{DD}$ node. The resistors Rn and Rp stand for associated spreading resistance of the N-well 80 and the P-type silicon substrate 8 as well, so as to enhance the stability of the silicon-controlled rectifier 3.

Figure 9:
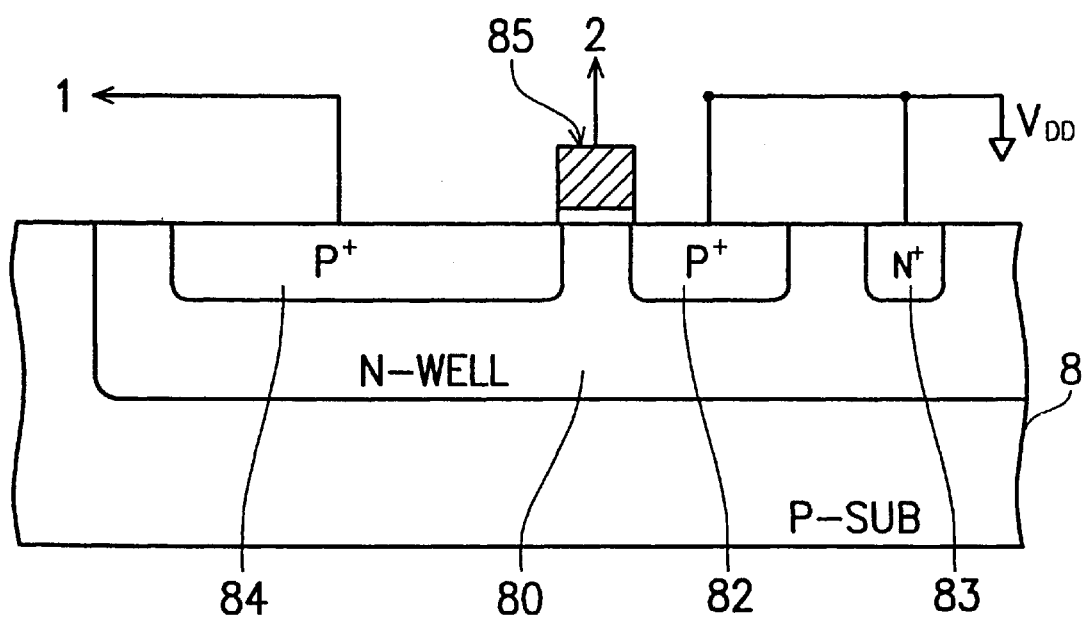
FIG. 9 illustrates a cross-sectional view taken along line IX—IX of FIG. 7.

Referring to FIG. 9, a cross-sectional view of FIG. 7, taken along line IX—IX, is illustrated. As shown in FIG. 6, the PMOS transistor Mp is provided with its drain, gate, and source constituted by the P-type doped region 84, gate structure 85, and P-type doped region 82, respectively. The P-type doped region 84 is connected to the pad 1 when the P-type doped region 82 is connected to the $V_{DD}$ node. However, the gate structure 85 is coupled to the internal circuit 2. Furthermore, although the layout of the PMOS transistor Mp is exemplified in T-shape, multi-finger type, waffle-type, closed-loop (e.g., square, hexagon, octagon, etc.) are suited to implementing the PMOS layout as well.

As to the CMOS fabrication of 0.35~0.8 μm, the PMOS transistor Mp will enter breakdown at a voltage in the range of about 9~13V. When ESD stress occurs to the output pad 1, the PMOS transistor Mp first breaks down to immediately forward bias the junction between the P-type doped region 82 and the N-well 80 so that the PNP transistor Qp is turned on to trigger the silicon-controlled rectifier 3 to operate in the snapback region and conduct a discharge current. Thereafter, all the discharge current flows through the silicon-controlled rectifier 3 instead of the PMOS transistor Mp. Therefore, the conduction of the silicon-controlled rectifier 3 bypasses the ESD stress that occurs to the pad 1 and the internal circuit 2 can be protected from ESD damage.

In conclusion, if integral with the NMOS transistor Mn, the silicon-controlled rectifier 3 is provided with the emitter and base of the NPN bipolar junction transistor Qn acting as the source and bulk of the NMOS transistor Mn. On the other hand, if integral with the PMOS transistor Mp, the silicon-controlled rectifier 3 is provided with the emitter and base of the PNP bipolar junction transistor Qp acting as the source and bulk of the PMOS transistor Mp.

In accordance with the present invention, either the NMOS transistor Mn or the PMOS transistor Mp is utilized to trigger the silicon-controlled rectifier without taking up ESD protection. Therefore, the required layout area for the MOS transistors Mn and Mp can be decreased, while the output buffer can be implemented merely in consideration of its driving requirement. In addition, the triggered turn-on silicon-controlled rectifier conducts a great amount of discharge current. Therefore, such a structure is advantageous to miniaturization of the integrated circuit and further enhances ESD immunity as well.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention to practice various other embodiments and make various modifications suited to the particular use contemplated. It is intended that the scope of the invention be defined by the following claims and their equivalents.

What is claimed is:

1. A method of protecting a circuit during an ESD event, the circuit including an MOS transistor of an output buffer on a semiconductor substrate, the MOS transistor being of a first conductivity type while said semiconductor substrate is of a second conductivity type, said method comprising the steps of:

providing a plurality of wells formed in said semiconductor substrate, said plurality of wells being of said first conductivity type;

forming a first doped region in said semiconductor substrate connected to a circuit node, said first doped region being of said first conductivity type;

forming a plurality of doped regions in said wells, the doped regions in the wells being of said second conductivity type;

forming a second doped region spaced apart from said wells, wherein the wells are formed in said semiconductor substrate such that they are symmetrical with reference to said second doped region and wherein the doped regions in the wells and the second doped region are connected to an output pad; and forming a gate structure overlaying a portion of said semiconductor substrate between said first doped region and said second doped region and being coupled to an internal circuit;

wherein said first doped region, said plurality of wells, the semiconductor substrate, and said first doped region constitute a silicon-controlled rectifier, and said first and second doped regions and said gate structure constitute said MOS transistor, and said MOS transistor is configured with a T-shape layout.

2. The method as claimed in claim 1, wherein said MOS transistor is an NMOS transistor.

3. The method as claimed in claim 1, wherein said MOS transistor is an PMOS transistor.

4. The method of claim 1, further comprising:

forming a second doped region of the second conductivity type in said semiconductor substrate connected to said circuit node; and forming a plurality of third doped regions of the first conductivity type in said wells and connected to said output pad.

5. A method of protecting an internal circuit during an ESD event, said internal circuit being provided on a semiconductor substrate, said method comprising the steps of:

forming a well of a first conductivity type in said semiconductor substrate, which is of a second conductivity type;

forming a doped region of a second conductivity type in said well;

forming a first doped region of a first conductivity type in said semiconductor substrate, said first doped region being connected to a circuit node;

forming a second doped region of a first conductivity type in said semiconductor substrate and spaced apart from said well, wherein said doped region of a second conductivity type and the second doped region are connected to an output pad; and forming a gate structure overlaying a portion of said semiconductor substrate between said first and second doped regions and coupled to said internal circuit;

wherein the doped region of the second conductivity type, the well, the semiconductor substrate, and the first doped region constitute a silicon-controlled rectifier, and said first and second doped regions and said gate structure constitute a MOS transistor, wherein said MOS transistor is configured with a T-shape layout;

wherein said silicon-controlled rectifier triggers to snapback by a current generated when said transistor enters breakdown during said ESD event.

6. The method of claim 5, further comprising the steps of:

forming a second doped region of a second conductivity type in said well connected to said circuit node; and forming a third doped region of a first conductivity type in said semiconductor substrate connected to said output pad.

7. A method of protecting an internal circuit during an ESD event, said internal circuit being provided on a semiconductor substrate, said method comprising the steps of:

forming a plurality of wells of a first conductivity type in said semiconductor substrate, which is of a second conductivity type;

forming a plurality of doped regions of a second conductivity type in said wells;

forming a first doped region of a first conductivity type in said semiconductor substrate, said first doped region being connected to a circuit node;

forming a second doped region of a first conductivity type in said semiconductor substrate and spaced apart from said wells, wherein said wells are symmetrical with reference to said second doped region, and said plurality of doped regions of a second conductivity type and the second doped region are connected to an output pad; and forming a gate structure overlaying a portion of said semiconductor substrate between said first and second doped regions and coupled to said internal circuit;

wherein said plurality of doped regions of a second conductivity type, the wells, the semiconductor substrate, and the first doped region constitute a silicon-controlled rectifier, and said first and second doped regions and said gate structure constitute a MOS transistor;

wherein said silicon-controlled rectifier triggers to snapback by a current generated when said MOS transistor enters breakdown during said ESD event.

8. The method of claim 7, wherein said MOS transistor is configured with a T-shape layout.

* * * * *